United States Patent [19]
Jang

[11] Patent Number: 5,707,721
[45] Date of Patent: Jan. 13, 1998

[54] METHODS OF FORMING FIELD EFFECT TRANSISTORS HAVING OXIDATION-CONTROLLED GATE LENGTHS

[75] Inventor: Young-Soo Jang, Kyungki-do, Rep. of Korea

[73] Assignee: Samsung Electronics Co., Ltd., Suwon, Rep. of Korea

[21] Appl. No.: 711,047

[22] Filed: Sep. 10, 1996

[30] Foreign Application Priority Data

Sep. 29, 1995 [KR] Rep. of Korea ............ 95-33021

[51] Int. Cl.$^6$ .................................................. H01L 21/336
[52] U.S. Cl. .................... 438/294; 438/304; 438/305
[58] Field of Search ............................ 437/29, 35, 44; 438/294, 295, 297, 304, 305

[56] References Cited

U.S. PATENT DOCUMENTS 5,595,919  1/1997  Pan ............................................. 437/44

FOREIGN PATENT DOCUMENTS

| | | | |
|---|---|---|---|
| 58-158970 | 9/1983 | Japan | 437/44 |
| 2-162738 | 6/1990 | Japan | 437/44 |
| 4-74438 | 3/1992 | Japan | 437/44 |
| 6-29310 | 2/1994 | Japan | 437/44 |
| 6-120242 | 4/1994 | Japan | 437/44 |
| 6-97190 | 4/1994 | Japan | 437/44 |

Primary Examiner—John Niebling
Assistant Examiner—Michael S. Lebentritt
Attorney, Agent, or Firm—Myers, Bigel, Sibley & Sajovec, L.L.P.

[57] ABSTRACT

Methods of forming field effect transistors having oxidation-controlled gate lengths include the steps of forming an insulated gate electrode on a face of semiconductor substrate. The gate electrode has exposed ends thereof which define an initial gate length. Source and drain region dopants are then implanted into first portions of the face, using the insulated gate electrode as an implant mask. The implanted first portions of the face and the exposed ends of the insulated gate electrode are then thermally oxidized to form a relatively thick oxide layer. During this step, the implanted dopants are diffused and bird's beak oxide extensions are formed at the upper and bottom corners of the gate electrode. The bird's beak oxide extensions are preferably formed to increase the separation distance between the gate electrode and the source and drain regions and thereby reduce the gate-source/drain capacitance and inhibit parasitic hot electron injection from the drain region. The step of thermally oxidizing the exposed ends of the insulated gate electrode also causes the ends to be consumed and the first portions of the face to become recessed. Thus, during oxidation, the length of the gate electrode can be reduced in a controlled manner and the degree of vertical overlap between the gate electrode and the diffused source and drain region dopants can be reduced to obtain a further reduction in the parasitic gate-source/drain capacitance. In addition, gate lengths having sub-micron dimensions can be achieved without requiring sub-micron photolithographic line widths to define the gate electrode.

15 Claims, 3 Drawing Sheets

1

METHODS OF FORMING FIELD EFFECT TRANSISTORS HAVING OXIDATION-CONTROLLED GATE LENGTHS

FIELD OF THE INVENTION

The present invention relates to semiconductor devices and methods of fabrication, and more particularly to field effect transistors and methods of forming field effect transistors.

BACKGROUND OF THE INVENTION

As state-of-the-art computer systems and circuits evolve, there is a continuing need to shrink or scale down the size of active devices contained therein to obtain higher degrees of integration and improved device performance. In order to achieve further advances in device scaling, improved lithographic techniques and equipment must be developed. However, because the lithographic patterning tolerances of state-of-the-art equipment may be rapidly reaching its limits and because lithographic errors within the normal tolerance range can impede efforts to further shrink device size, it would be advantageous to develop processes and device geometries less dependent on photolithographic accuracy.

In the case of field effect transistors, techniques to shrink active devices have included self-alignment techniques which bring the source and drain contacts closer to the gate, with reduced reliance on photolithographic accuracy. For example, FIG. 1 illustrates a cross-section of an enhancement-mode metal-oxide-semiconductor field effect transistor (MOSFET) having self-aligned source and drain regions 120, 124, sidewall spacers 144, a gate oxide insulating layer 130, insulated gate electrode 140, intermediate silicide contact layers 150, isolation region 160 and source, gate and drain contacts 170. To limit parasitics such as gate-to-drain leakage currents caused by injection of high energy ("hot) electrons into the gate oxide 130, self-aligned lightly doped source and drain region extensions 122, 126 are provided. As will be understood by those skilled in the art, the lightly doped drain region extension performs the function of spreading the drain-to-channel voltage drop as evenly as possible. This reduces the occurrence of hot electron injection which can lead to interface traps and oxide wear-out. In particular, as illustrated by FIGS. 2A-2B, the lightly doped source and drain region extensions 122 and 126 are preferably formed by patterning the insulated gate electrode 140 and then performing a relatively low dose implant of source and drain region dopants, using the gate electrode 140 as an implant mask. Then, an oxide layer 142 is conformally deposited on the insulated gate electrode 140. An anisotropic etching step is then performed to pattern the oxide layer 142 into sidewall oxide spacers 144. The sidewall oxide spacers 144 are then used as a mask while performing a relatively high dose implant of the source and drain region dopants. The implanted dopants are then driven-in to form source and drain regions 120 and 124 having lightly doped extensions 122 and 144.

Unfortunately, while the above described method reduces reliance on photolithograpic accuracy, the parasitic gate-source/drain capacitance can still be appreciable between the bottom corners of the gate electrode and the lightly doped extensions. Moreover, parasitic hot electron injection may still be present. Thus, notwithstanding the above described method, there still continues to be a need for improved methods of forming field effect transistors having sub-micron gate lengths, reduced parasitic capacitances and reduced susceptibility to hot electron injection.

SUMMARY OF THE INVENTION

It is therefore an object of the present invention to provide improved methods of forming field effect transistors.

It is another object of the present invention to provide methods of forming field effect transistors having self-aligned lightly doped source and drain region extensions.

It is also an object of the present invention to provide methods of forming field effect transistors having reduced susceptibility to field-induced hot electron injection.

It is a further object of the present invention to provide methods of forming field effect transistors having reduced parasitic gate-source/drain capacitance.

It is still a further object of the present invention to provide methods of forming field effect transistors having sub-micron gate lengths.

These and other objects, features and advantages of the present invention are provided by methods of forming field effect transistors (FETs) which include the steps of forming an insulated gate electrode on a face of a semiconductor substrate by initially forming a first insulating layer on the face. A conductive semiconductor layer is then formed on the first insulating layer, opposite the face. An upper insulating layer is then formed on the conductive semiconductor layer and then a layer of silicon nitride is deposited on the upper insulating layer. These layers are then patterned using conventional etching techniques to form an insulated gate electrode having a second insulating layer and silicon nitride layer thereon and exposed sidewalls or ends which define an initial gate length.

First source and drain region dopants are then implanted in a self-aligned manner using the insulated gate electrode as an implant mask. Here, the dopants are implanted through the first insulating layer and into first portions of the face, adjacent the sidewalls of the insulated gate electrode. The first portions of the face and the exposed ends of the insulated gate electrode are then thermally oxidized to form a relatively thick oxide layer having a thickness in a range between about 1000 Å and 2000 Å as measured normal to the face. During this step, the silicon nitride layer is used as a mask to inhibit oxidation of an upper surface of the insulated gate electrode, however the presence of the second insulating layer typically facilitates the formation of bird's beak oxide extensions which extend between the silicon nitride layer and top corners of the insulated gate electrode. The presence of the first insulating layer also facilitates formation of bird's beak oxide extensions at the bottom corners of the insulated gate electrode. According to a preferred aspect of the present invention, the formation of the relatively thick bird's beak oxide extensions at the bottom corners of the insulated gate electrode reduces the gate-source/drain capacitance and also inhibits parasitic hot electron injection from the drain which can deteriorate device performance.

During the thermal oxidation step, the implanted first source and drain region dopants are also diffused into the substrate. In particular, the first source and drain region dopants preferably diffuse laterally underneath the insulated gate electrode to define relatively lightly doped source and drain region extensions. According to another preferred aspect of the present invention, the step of thermally oxidizing the exposed ends of the insulated gate electrode causes the ends to be consumed and the first portions of the face to become recessed. Thus, during oxidation, the length of the gate electrode is reduced simultaneously with the lateral diffusion of the first source and drain region dopants underneath the gate electrode. This reduces the degree of overlap between the gate electrode and the source and drain region extensions. This shortening of the gate length results in a further reduction in parasitic gate-source/drain capacitance during operation. Moreover, gate lengths having sub-micron dimensions can be achieved without requiring submicron photolithographic line widths to define the gate electrode. For example, according to the present invention, an initial gate length of greater than about 0.8 μm can be reduced by more than 0.2 μm using the above described oxidation step. Thus, an initial 1 μm gate linewidth can be reduced to less than 0.8 μm by oxidizing the ends thereof.

The relatively thick oxide layer is then dry etched using a reactive ion etching (RIE) technique and the silicon nitride layer as a etching mask. Here, the silicon nitride layer is used both as an oxidation inhibiting mask and as an etching mask. This dry etching step results in the formation of sidewall spacers which extend between the ends of the silicon nitride layer and the recessed first portions of the face. High levels of second source and drain region dopants are then implanted into the recessed first portions of the face, using the insulated gate electrode and sidewall spacers as an implant mask. This implant (and subsequent diffusion) results in the formation of relatively highly doped source and drain regions having relatively lightly doped source and lightly doped drain region extensions. The silicon nitride layer and second insulating layer on the upper surface of the insulated gate electrode are then removed. A sintering step is then performed to form self-aligned intermediate silicide contacts on the recessed first portions of the face and on the upper surface of the gate electrode. Source, drain and gate contacts are then formed by depositing oxide and borophosphosilicate glass (BPSG) to form an electrical isolation layer, opening vias therein and then patterning metallization in the vias to form connections to the intermediate silicide contacts.

DESCRIPTION OF PREFERRED EMBODIMENTS

Figure 1:
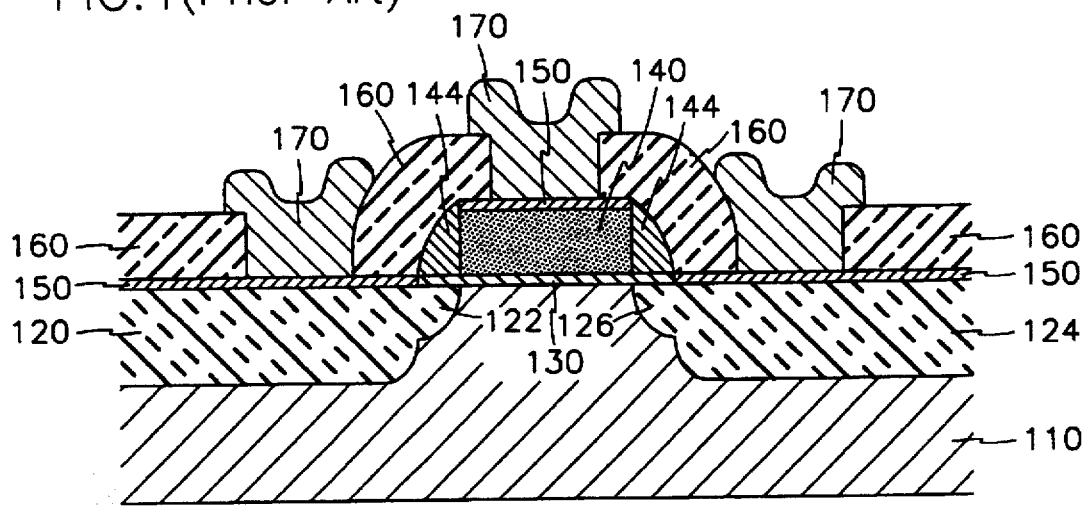
FIG. 1 illustrates a schematic cross-sectional view of a field effect transistor having lightly doped drain and source region extensions, according to the prior art.
Figure 2A:
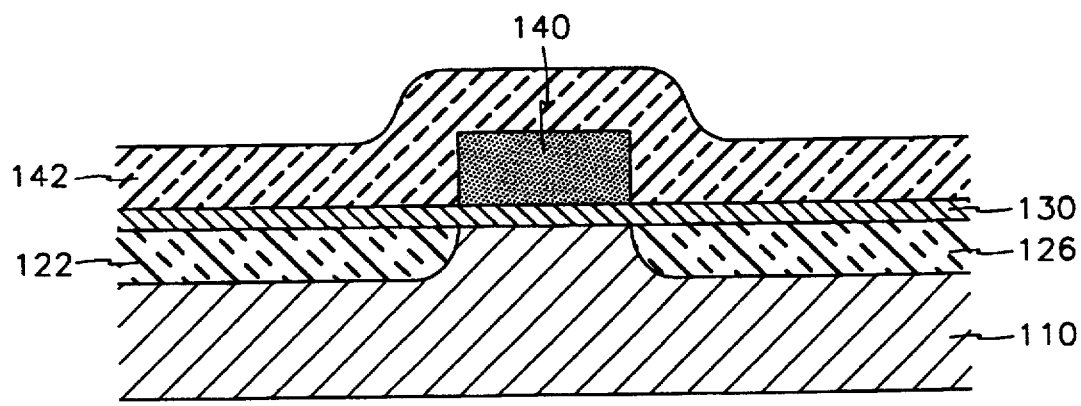
FIGS. 2A-2B illustrate schematic cross-sectional views of intermediate structures illustrating a method of forming the field effect transistor of FIG. 1.
Figure 2B:
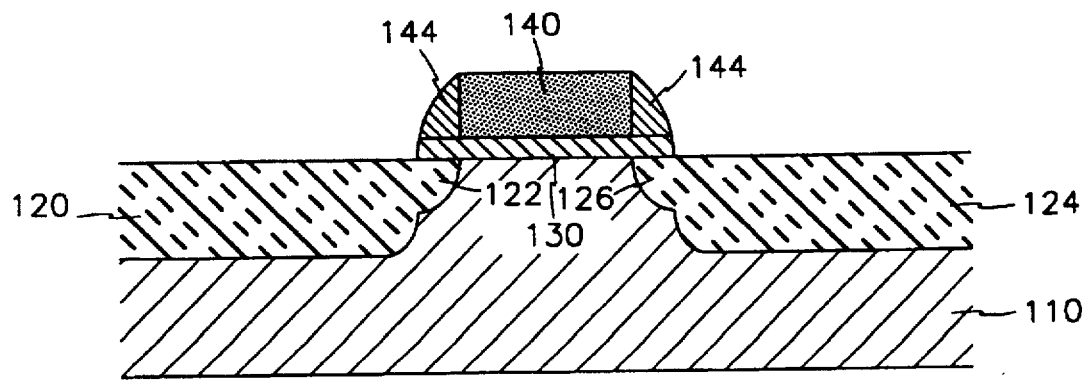
Figure 3:
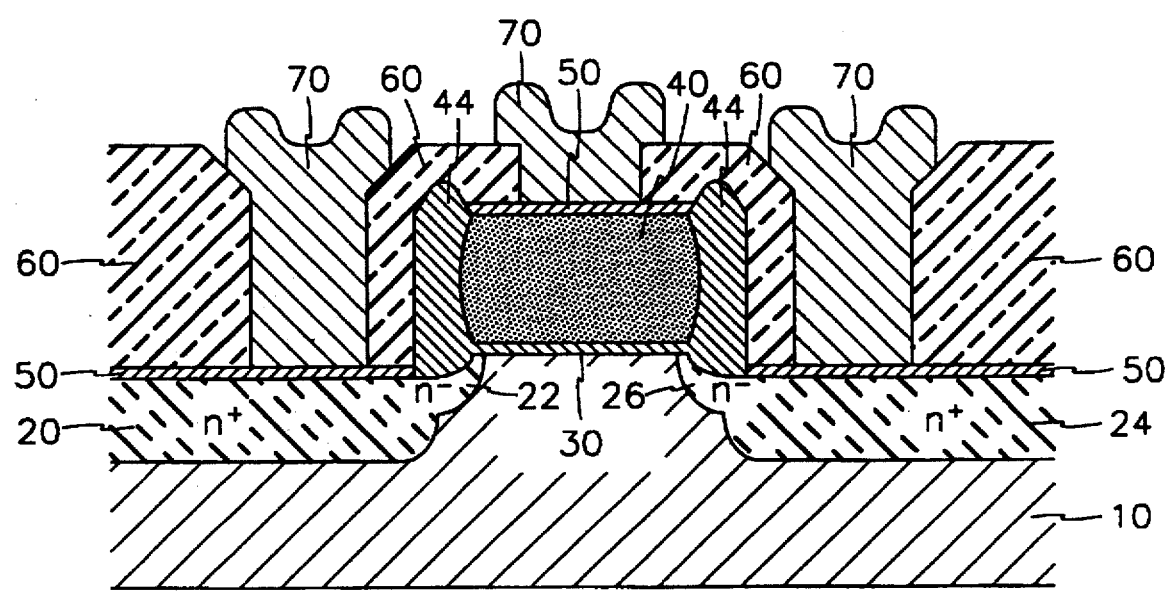
FIG. 3 illustrates a schematic cross-sectional view of a field effect transistor having lightly doped drain and source region extensions, according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Figure 4A:
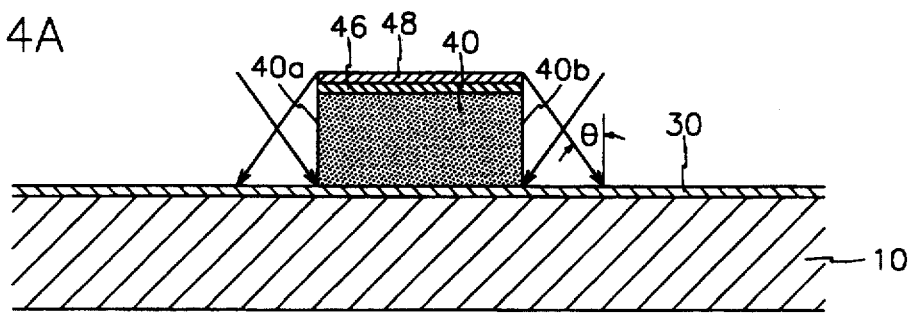
FIGS. 4A-4D illustrate schematic cross-sectional views of intermediate structures illustrating a method of forming the field effect transistor of FIG. 3.

Referring now to FIGS. 3 and 4A-4D, a preferred method of forming a field effect transistor according to the present invention will be described. In particular, FIG. 4A illustrates the steps of forming an insulated gate electrode 40 on a face of a semiconductor substrate 10 by initially forming a first insulating layer 30 (e.g., $SiO_2$) having a thickness in a range between about 70 Å and 150 Å on the face. The first insulating layer 30 may be formed by thermally oxidizing the face or depositing an insulating layer thereon, for example. To form an N-channel enhancement mode field effect transistor, the semiconductor substrate 10 may be of P-type conductivity or contain a region (e.g., well) of P-type conductivity therein. A conductive semiconductor layer is then formed on the first insulating layer 30, opposite the face. The conductive semiconductor layer may comprise a polycrystalline silicon layer having a preferred thickness in a range between about 1000 Å and 2000 Å. The polycrystalline silicon layer may be doped in-situ to a predetermined conductivity type (e.g., N-type) or dopants may be implanted into an upper surface thereof and diffused after the layer has been deposited.

Referring still to FIG. 4A, another insulating layer (e.g., $SiO_2$) having a thickness in a range between about 70 Å and 150 Å is then formed on the conductive semiconductor layer. This insulating layer may be formed by oxidizing an upper surface of the conductive semiconductor layer or depositing an electrically insulating material thereon, for example. A layer of nitride (e.g., $Si_3N_4$) having a thickness in a range between about 500 Å and 1500 Å is then deposited on the insulating layer. These layers are then patterned using conventional etching techniques to form an insulated gate electrode 40 having a second insulating layer 46 and nitride layer 48 thereon and exposed sidewalls or ends 40a, 40b which define an initial gate length, as described more fully hereinbelow.

First source and drain region dopants (e.g., N-type) are then implanted in a self-aligned manner using the insulated gate electrode 40 as an implant mask. Here, the dopants are implanted through the first insulating layer 30 and into first portions of the face, adjacent the sidewalls of the insulated gate electrode 40. As illustrated, the dopants are preferably implanted at a predetermined tilt angle (θ) while simultaneously rotating the substrate to prevent shadowing. A typical dopant may include phosphorus implanted at an energy in a range between about 60 keV and 100 keV and at a dose level in a range between about $1 \times 10^{12}$ cm$^{-2}$ and $2 \times 10^{13}$ cm$^{-2}$.

Figure 4B:
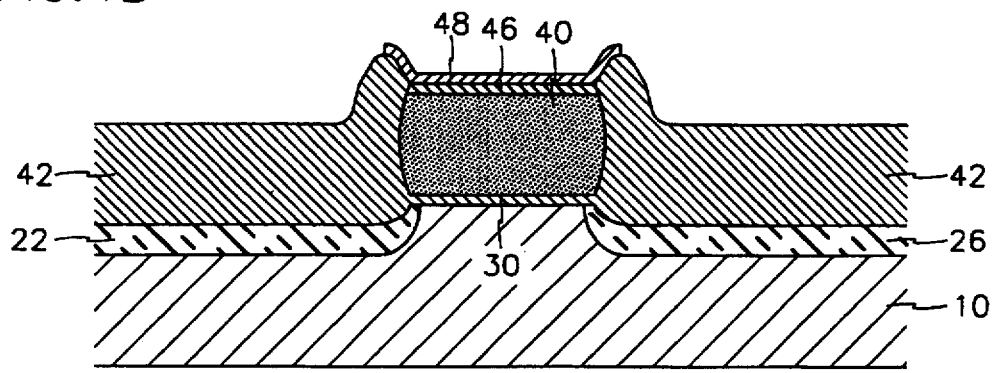

Referring now to FIG. 4B, the first portions of the face and the exposed ends 40a, 40b of the insulated gate electrode 40 are then thermally oxidized at a temperature between about 900°-950° C. to form a relatively thick oxide layer 42 having a thickness in a range between about 1000 Å and 2000 Å as measured normal to the surface. During this step, the nitride layer 48 is used as a mask to inhibit oxidation of an upper surface of the insulated gate electrode 40, however the presence of the second insulating layer 46 typically facilitates the formation of bird's beak oxide extensions which extend between the nitride layer 48 and top corners of the insulated gate electrode 40, when viewed in transverse cross-section as illustrated. The presence of the first insulating layer 30 also facilitates formation of bird's beak oxide extensions at the bottom corners of the insulated gate electrode 40, as illustrated. As will be understood by those skilled in the art, the formation of these relatively thick bird's beak extensions at the bottom corners of the insulated gate electrode 40 reduces the gate-source/drain capacitance and also inhibits parasitic hot electron injection from the drain which can deteriorate device performance and even result in device failure. During the thermal oxidation step, the implanted first source and drain region dopants are also diffused into the substrate 10. In particular, the first source and drain region dopants preferably diffuse laterally underneath the insulated gate electrode 40 to define relatively lightly doped source and drain region extensions 22 and 26, respectively. As will be understood by those skilled in the art, these extensions define the channel region of the field effect transistor which extends therebetween.

According to a preferred aspect of the present invention, the above step of thermally oxidizing the exposed ends 40a, 40b of the insulated gate electrode 40 causes the ends to be consumed and the first portions of the face to become recessed. Thus, during oxidation, the length of the gate electrode 40 is reduced simultaneously with the lateral diffusion of the first source and drain region dopants underneath the gate electrode. As determined by the inventor herein, thermally oxidizing the ends 40a, 40b reduces the degree of overlap between the gate electrode and the source and drain region extensions 22 and 26. This shortening of the gate length results in a further reduction in parasitic gate-source/drain capacitance during operation. Moreover, gate lengths having sub-micron dimensions can be achieved without requiring sub-micron photolithographic line widths to define the gate electrode. For example, according to the present invention, an initial gate length of greater than about 0.8 µm can be reduced by more than 0.2 µm using the above described oxidation step. Thus, the original 1 µm gate linewidth can be reduced to less than 0.8 µm by oxidizing the ends thereof.

Figure 4C:
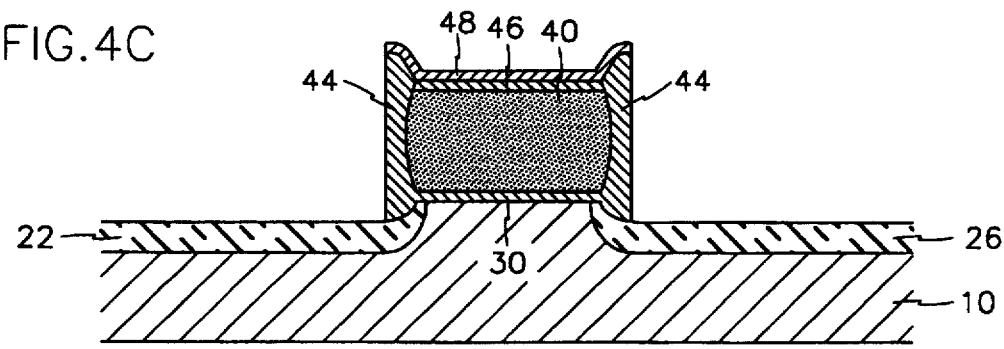
Figure 4D:
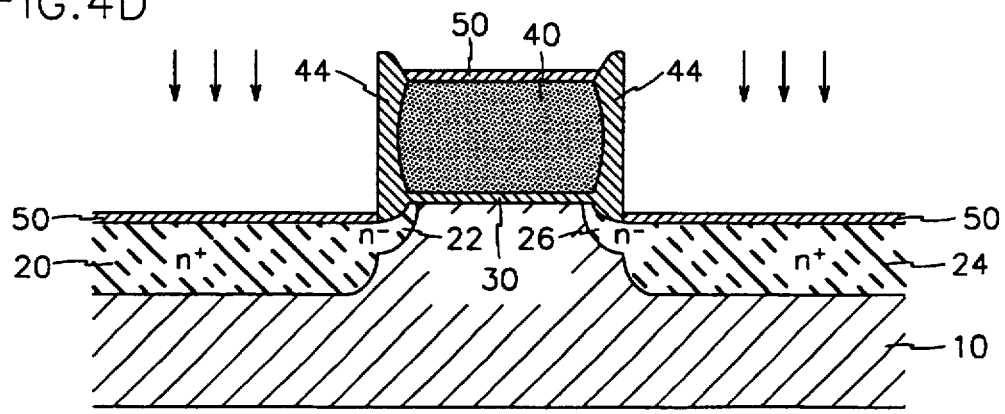

Referring now to FIG. 4C, the relatively thick oxide layer 42 is then dry etched using a reactive ion etching (RIE) technique and the nitride layer 48 as an etching mask. Thus, the nitride layer 48 is used both as an oxidation inhibiting mask and as an etching mask. As illustrated, the dry etching step results in the formation of sidewall spacers 44 which extend between the ends of the nitride layer 48 and the recessed first portions of the face. Referring now to FIG. 4D, high levels of second source and drain region dopants (e.g., arsenic) are then implanted into the recessed first portions of the face, using the insulated gate electrode 40 and sidewall spacers 44 as an implant mask. This implant (and subsequent diffusion) results in the formation of relatively highly doped source and drain regions 20 and 24 having relatively lightly doped source and lightly doped drain extensions 22 and 26, respectively. The nitride layer 48 and second insulating layer 46 are then removed. A sintering step is then performed in a non-active gas mode at about 900° C. to form self-aligned intermediate silicide contacts 50 on the recessed first portions of the face and on the upper surface of the gate electrode 40. As illustrated best by FIG. 3, source, drain and gate contacts 70 are then formed by depositing oxide and borophophosilicate glass (BPSG) to form an electrical isolation layer 60, opening vias therein and then patterning metallization to form connections to the intermediate silicide contacts 50.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field effect transistor, comprising the steps of:

forming an insulated gate electrode having first and second ends defining an initial length thereof, on a face of a semiconductor substrate of first conductivity type;

patterning a nitride layer on the insulated gate electrode, opposite the face;

implanting first source and drain region dopants of second conductivity type into first portions of the face, using the insulated gate electrode as an implant mask;

oxidizing the first portions of the face and the first and second ends of the insulated gate electrode to reduce the length thereof, while simultaneously diffusing the implanted first source and drain region dopants into the substrate to form source and drain region extensions, said source and drain region extensions defining a channel region therebetween extending opposite the insulated gate electrode;

patterning the insulated gate electrode by etching the oxidized first and second ends thereof using the patterned nitride layer as an etching mask, to define oxide spacers at the first and second ends, the oxide spacers having sidewalls which are self-aligned to edges of the patterned nitride layer; and implanting second source and drain region dopants of second conductivity type into the first portions of the face, using the oxide spacers as an implant mask.

2. The method of claim 1, wherein said step of forming an insulated gate electrode comprises the steps of:

forming a first insulating layer on the face;

forming a conductive semiconductor layer on the first insulating layer, opposite the face; and patterning the conductive semiconductor layer using a mask, to expose the first and second ends.

3. The method of claim 2, wherein said oxidizing step comprises thermally oxidizing the conductive semiconductor layer at the first and second ends, using the patterned nitride layer as a mask to inhibit thermal oxidation of a top surface of the conductive semiconductor layer.

4. The method of claim 3, wherein the initial length of the insulated gate electrode is greater than about 0.8 µm; and wherein said oxidizing step comprises thermally oxidizing the conductive semiconductor layer at the first and second ends to reduce the length of the insulated gate electrode by greater than about 0.2 µm.

5. The method of claim 2, wherein said step of forming a conductive semiconductor layer comprises the steps of depositing a polycrystalline silicon layer on the first insulating layer and doping the polycrystalline silicon layer by implanting dopants of second conductivity type at an energy in a range between about 60 and 100 keV and at a dose level in a range between about $1\times10^{12}$ cm$^{-2}$ and $2\times10^{13}$ cm$^{-2}$.

6. The method of claim 5, wherein said first insulating layer forming step comprises forming an first oxide layer having a thickness in a range between about 70 and 150 Å; wherein said step of depositing a polycrystalline silicon layer comprises depositing a polycrystalline silicon layer having a thickness in a range between about 1000 Å and 2000 Å.

7. The method of claim 2, wherein said step of patterning a nitride layer on the insulated gate electrode is preceded by the step of forming a second insulating layer on the insulated gate electrode.

8. The method of claim 7, wherein said step of forming a second insulating layer comprises forming a second oxide layer having a thickness in a range between about 70 and 150 Å.

9. The method of claim 7, further comprising the steps of removing the patterned nitride layer and second insulating layer from the insulated gate electrode to expose an upper surface thereof; and forming a first silicide layer on the exposed upper surface of the insulated gate electrode.

10. The method of claim 9, further comprising the step of forming a second silicide layer on the first portions of the face.

11. The method of claim 10, further comprising the steps of forming a gate electrode contact on the first silicide layer and forming source and drain contacts on the second silicide layer.

12. A method of forming a field effect transistor, comprising the steps of:

forming a first layer of oxide on a face of a semiconductor substrate of first conductivity type; then forming a polycrystalline layer of second conductivity type on the first layer of oxide; then forming a second layer of oxide on an upper surface of the polycrystalline silicon layer; then forming a silicon nitride layer on the second layer of oxide, opposite the polycrystalline layer; then forming an insulated gate electrode having an initial length by etching the silicon nitride layer, second layer of oxide and polycrystalline layer of second conductivity type to expose first and second ends thereof, using a mask; then implanting first source and drain region dopants of second conductivity type at a first dose level into first portions of the face, using the insulated gate electrode as an implant mask; then oxidizing the first portions of the face and the first and second exposed ends of the insulated gate electrode to reduce the length thereof, while simultaneously diffusing the implanted first source and drain region dopants into the substrate to form source and drain region extensions extending laterally in the substrate underneath the insulated gate electrode, said source and drain region extensions defining a channel region therebetween extending opposite the insulated gate electrode; then patterning the insulated gate electrode by etching the oxidized first and second ends thereof to define sidewall spacers at the first and second ends and expose recessed first portions of the face, using the etched silicon nitride layer as a etching mask so that the sidewall spacers are self-aligned to the etched silicon nitride layer; and implanting second source and drain region dopants of second conductivity type at a second dose level, greater than the first dose level, into the recessed first portions of the face.

13. The method of claim 12, further comprising the step of sintering the recessed portions of the face at a temperature in a range between about 850° C. and 950° C.

14. The method of claim 9, wherein said step of forming a first silicide layer comprises sintering the exposed upper surface of the insulated gate electrode at a temperature in a range between about 850° C. and 950° C.

15. The method of claim 14, wherein said sintering step comprises sintering the first portions of the face at a temperature in a range between about 850° C. and 950° C.

* * * * *